United States Patent [19]

Rezeanu

[11] Patent Number: 5,825,715
[45] Date of Patent: Oct. 20, 1998

[54] METHOD AND APPARATUS FOR PREVENTING WRITE OPERATIONS IN A MEMORY DEVICE

[75] Inventor: Stefan-Cristian Rezeanu, Colorado Springs, Colo.

[73] Assignee: Cypress Semiconductor Corp., San Jose, Calif.

[21] Appl. No.: 855,040

[22] Filed: May 13, 1997

[51] Int. Cl.[6] ................................................. G11C 8/00
[52] U.S. Cl. .................. 365/233.5; 365/191; 365/230.03
[58] Field of Search ................................ 365/233.5, 191, 365/230.03

[56] References Cited

U.S. PATENT DOCUMENTS

| | | | |
|---|---|---|---|
| 4,099,265 | 7/1978 | Abe | 365/190 |
| 4,161,040 | 7/1979 | Satoh | 365/203 |
| 4,338,679 | 7/1982 | O'Toole | 365/203 |
| 4,355,377 | 10/1982 | Sud et al. | 365/203 |
| 5,434,824 | 7/1995 | Matsuzaki | 365/233.5 |
| 5,515,323 | 5/1996 | Yamazaki et al. | 365/155 |
| 5,519,666 | 5/1996 | McAdams | 365/233.5 |
| 5,548,560 | 8/1996 | Stepphens, Jr. et al. | 365/233.5 |
| 5,566,129 | 10/1996 | Nakashima et al. | 365/233.5 |
| 5,594,691 | 1/1997 | Bashir | 365/189.09 |
| 5,602,795 | 2/1997 | Sandhu | 365/230.06 |
| 5,617,350 | 4/1997 | Roohparvar | 365/185.02 |
| 5,654,936 | 8/1997 | Cho | 365/233.5 |

OTHER PUBLICATIONS

Karl L. Wang et al., "A 21–ns 32Kx8 CMOS Static RAM with a Selectively Pumped p–Well Array", *IEEE Journal of Solid–State Circuits*, vol. SC–22, No. 5, pp. 704–711, (Oct. 1987).

Larry F. Childs and Ryan T. Hirose, "An 18 ns 4Kx4 CMOS SRAM", *IEEE Journal of Solid–State Circuits*, vol. SC–19, No. 5, pp. 545–551, (Oct. 1984).

Katsuro Sasaki et al., "A 15–ns 1–Mbit CMOS SRAM", *IEEE Journal of Solid–State Circuits*, vol. SC–23, No. 5, pp. 1067, 1069–1072, (Oct. 1988).

Takayasu Sakurai et al., "A Low Power 46 ns 256 kbit CMOS Static RAM with Dynamic Double Word Line", *IEEE Journal of Solid–State Circuits*, vol. SC–19, No. 5, pp. 578–585, (Oct. 1984).

Cheng–Wei Chen et al., "A Fast 32Kx8 CMOS Static RAM with Address Transition Detection", *IEEE Journal of Solid–State Circuits*, vol. SC–22, No. 4, pp. 533–537, (Aug. 1987).

*Primary Examiner*—David C. Nelms
*Assistant Examiner*—Hien Nguyen
*Attorney, Agent, or Firm*—Blakely, Sokoloff, Taylor & Zafman LLP

[57] ABSTRACT

In a memory device, a write operation only to a desired memory location may be performed by recognizing an address transition and preventing a memory write to an undesired memory location in response thereto. The memory write to the undesired memory location may be prevented by blocking the memory write using an address transition detection (ATD) signal. This may include decoupling a bitline (e.g., using a passgate transistor) from a data signal in response to the ATD signal. Alternatively, the memory write may be prevented by pulsing an ATD signal to delay the memory write to the undesired memory location and then deasserting a data write signal to block the memory write. In one embodiment, a circuit which includes a memory cell and an isolation circuit coupled to the memory cell is provided. The isolation circuit may be configured to prevent a memory write to the memory cell in response to an ATD signal. By using the width of an ATD pulse to block the writing of an undesired memory location, the present invention provides improved address setup ($t_{SA}$) and address hold ($t_{HA}$) margins compared to solutions of the past. Preferably, the invention is implemented in a data write bus to bitline interface using passgate transistors to control access to a pair of bitlines by a data write bus. Alternatively, the invention may be implemented by combining an internal write signal with an ATD pulse in a data write bus driver within the memory device.

15 Claims, 8 Drawing Sheets

METHOD AND APPARATUS FOR PREVENTING WRITE OPERATIONS IN A MEMORY DEVICE

FIELD OF THE INVENTION

The present invention relates generally to write operations in memory devices and, more particularly, to optimizing certain timing margins within a write cycle of a memory device.

BACKGROUND

Fast CMOS static random access memories (RAMs) have become increasingly important in computer systems which require high speed and low standby current. A conventional RAM write architecture block diagram is illustrated in FIG. 1. Input data signals (Data_In_Pad) from an input/output pad 5 are applied to the memory device and received at data buffer circuitry 10. Data buffer circuitry 10 is part of a data input path for the memory device and may receive TTL-compatible signals Data_In_Pad from I/O pad 5. Within the data buffer circuitry 10, the Data_In_Pad signals may be presented to a voltage level converter circuit which converts the TTL-level signals to CMOS-compatible signals for use in the memory device. The data buffer circuitry 10, which may also contain delay circuits to align the data signals, generates a Data_In signal which further propagates through an internal data input bus 12.

An Internal_Write signal 14 may be generated from the write enable ($\overline{WE}$) and/or chip enable ($\overline{CE}$) signals presented to the memory device. For example, using write control logic 22 signal Internal_Write 14 is developed from the $\overline{CE}$ and $\overline{WE}$ signals. Signal Internal_Write 14 is subsequently applied to the input of data write driver 24.

At data write driver 24, signal Data_In is combined with signal Internal_Write 14 to produce internal write signals $\overline{datawrt0}$ and $\overline{datawrt1}$ which are logic complements during write operations. The internal write signals $\overline{datawrt0}$ and $\overline{datawrt1}$ are applied to the appropriate bitlines of the memory device through a data write bus 16 and a bitline interface to write data into selected individual memory cells.

For those memory devices which are organized into a number of groups of memory cells, each group of cells will have a corresponding bitline interface 20a–20p. The bitline interfaces 20a–20p are typically activated in response to group select signals Group(0)–Group(n), generated from address signals $A_0$–$A_m$ by a group select logic block 26. Thus, bitline interface 20a corresponds to Group(0), etc., and in general, bitline interface 20p corresponds to Group (n).

Portions of the read path circuitry for the memory device are also illustrated in FIG. 1. Bitline signals from a pair of bitlines BL and $\overline{BL}$ are received by sense amplifiers 28a–28p. In response to corresponding Group_Enable signals (not shown), the sense amplifiers 28a–28p generate signals Data_Out which are provided to a global data read bus. In some embodiments, the global data read bus and global data write bus 16 may be the same bus. The Data_Out signals on the global data read bus may be provided to further circuitry to generate the output signals which are provided to the I/O pads (e.g., I/O pad 5).

In general, RAMs such as the one illustrated in FIG. 1 have been required to provide faster and faster access times to accommodate ever increasing processor and bus speeds. Correspondingly, the write cycle time decreases, which translates to a narrower internal write signal (pulse). However, the timing of the internal write pulse ($\overline{datawrt0}$ or $\overline{datawrt1}$) impacts several write parameters, as discussed briefly below.

Consider, for example, the timing diagram of FIG. 2. A write cycle may be characterized by an overall write cycle time two which represents the time that an address for a given memory write cycle is present on an address bus. A write enable signal $\overline{WE}$ alone is used in the illustration, where $\overline{CE}$ is assumed to-be low (i.e., active) during two; this results in a $\overline{WE}$ controlled write. In general, the write enable signal is presented to an external pin on the memory device and may be used in conjunction with other signals (e.g., $\overline{CE}$) to produce an internal write enable signal (e.g., signal Internal_Write 14 in FIG. 1). At some point after the address information presented on the bus is valid, a data signal Data_In_Pad will be presented, e.g., on I/O pad 5. The signal Data_In_Pad should be valid a period $t_{SD}$ (data setup) before the rising edge of $\overline{WE}$, and also a period $t_{HD}$ (data hold) after it, so that the proper logic value may be written to the memory cells of the memory device.

As shown, before the write enable signal may be activated, a minimum address setup time $t_{SA}$ is required. Also, a minimum address hold time $t_{HA}$ following the end of the write (e.g., the rising edge of $\overline{WE}$ in FIG. 2) is also required. Improving the address timing margins ($t_{SA}$ and $t_{HA}$) is done in direct trade off with the margins for the write width parameters (e.g., $t_{PWE}$).

In FIG. 1, the necessary address timing margins ($t_{SA}$ and $t_{HA}$) are acquired by ensuring proper timing of the internal write pulses $\overline{datawrt0}$ and $\overline{datawrt1}$ with respect to the group select signals Group(0)–Group(n) at the input of the bitline interfaces 20a–20p. For a proper $t_{SA}$ margin, the beginning of the $\overline{datawrt0}$ (or $\overline{datawrt1}$) pulse should arrive after the group select signals enable the proper bitline interface according to the external address change which triggered the beginning of the write cycle $t_{WC}$. This ensures that the proper memory cell (e.g., cell 0 in FIG. 2) and not the previously addressed cell (e.g., cell 1 in FIG. 2) is written in the present write cycle. For a proper $t_{HA}$ margin, the end of the $\overline{datawrt0}$ (or $\overline{datawrt1}$) pulse should arrive at the bitline interfaces 20a–20p before the group select signals switch because of the external address change at the end of the write cycle $t_{WC}$. This prevents a write to the cell which will be selected by the external address combination after the end of $t_{WC}$ (e.g., cell 2 in FIG. 2).

In the past, the address timing margins were improved by delaying the beginning of the internal write pulse ($\overline{datawrt0}$ or $\overline{datawrt1}$) and speeding up its end. This directly translates into a narrower internal write pulse, because it is the internal write pulse which is adjusted. This is due to the continuously decreasing figure demanded for the necessary access time, which requires the address path to be as fast as possible, and one cannot afford to slow it down. It is now apparent that improving the address timing margins by narrowing the internal write pulse directly impacts the write width parameters (e.g., $t_{PWE}$), which require a large enough internal write pulse to be able to write the cell. Moreover, the requirement for continuously decreasing write cycle times imposes a lower limit for the width of the internal write pulse which, in turn, decrease the address timing margins which can be achieved using the old, above-described, technique.

SUMMARY OF THE INVENTION

The present invention provides a circuit and method for enhancing write parameter margins in a memory device without relying on narrowing an internal write pulse. In one embodiment, a write operation is performed by recognizing an address transition at a memory device and preventing a memory write to an undesired memory location in response to the address transition. The step of preventing the memory write to the undesired memory location may be performed by blocking the memory write using an address transition detection (ATD) signal. This may further include decoupling a bitline (e.g., using a passgate transistor) from a data signal in response to the ATD signal. Alternatively, the memory write to the undesired memory location may be prevented by pulsing an ATD signal to delay a memory write to the undesired memory location and then blocking the memory write by deasserting a data write signal.

In a further embodiment, a circuit which includes a memory cell and an isolation circuit coupled to the memory cell is provided. The isolation circuit may be configured to prevent a memory write to the memory cell in response to an ATD signal and may comprise a pair of passgate transistors.

In yet another embodiment of the present invention, the width of an ATD pulse is used to block the writing of an undesired memory location. This is preferably implemented at a data write bus to bitline interface, using passgate transistors to control access to a pair of bitlines by a data write bus. Alternatively, the present invention may be implemented by combining an internal write signal with an ATD pulse in a data write bus driver within a memory device.

The present invention achieves advantages over the solutions of the past in that it permits longer internal write pulses for shorter overall access times, thus benefiting those parameters which depend on the width of the internal write pulse. Further, the present invention also provides improved address setup ($t_{SA}$) and address hold ($t_{HA}$) margins for a similar write pulse duration. These advantages tend to indicate that the present invention is well suited for memory devices required to operate over large ranges of technology corners, temperatures and/or multiple supply voltages.

BRIEF DESCRIPTION OF THE DRAWINGS

The present invention is illustrated by way of example and not limitation in the figures of the accompanying drawings in which.

DETAILED DESCRIPTION

The present invention provides a circuit and method for enhancing write parameter margins in a memory device without relying on narrowing an internal write pulse. In one embodiment, a write operation is performed by recognizing an address transition at a memory device and preventing a memory write to an undesired memory location in response to the address transition. The step of preventing the memory write to the undesired memory location may be performed by blocking the memory write using an address transition detection (ATD) signal. This may further include decoupling a bitline (e.g., using a passgate transistor) from a data signal in response to the ATD signal. Alternatively, the memory write to the undesired memory location may be prevented by pulsing an ATD signal to delay a memory write to the undesired memory location and then blocking the memory write by deasserting a data write signal. In a further embodiment, a circuit which includes a memory cell and an isolation circuit coupled to the memory cell is provided. The isolation circuit may be configured to prevent a memory write to the memory cell in response to an ATD signal and may comprise a pair of passgate transistors.

The present invention achieves advantages over the solutions of the past in that it permits longer internal write pulses for shorter overall access times, thus benefiting those parameters which depend on the width of the internal write pulse. Further, the present invention also provides improved address setup ($t_{SA}$) and address hold ($t_{HA}$) margins for a similar write pulse duration. These advantages tend to indicate that the present invention is well suited for memory devices required to operate over large ranges of technology corners (e.g., any combination of slow/typical/fast for a PMOS/NMOS transistor pair which is potentially decreasing the width of the internal write pulse and/or changing the speed of the address path in an undesired direction with respect to the address setup or hold margins), temperatures and/or multiple supply voltages.

As will be discussed in greater detail below, in one embodiment of the present invention, the width (time duration) of an ATD pulse is used to block the writing of an undesired memory location. This is preferably implemented in a data write bus to bitline interface using passgate transistors to control access to a pair of bitlines by a data write bus. Alternatively, the present invention may be implemented by combining an internal write signal with an ATD pulse in a data write bus driver within a memory device. Further details of these alternative embodiments are presented below, however, it should be recognized that these embodiments are illustrative only and should not be read so as to limit the scope of the present invention.

Figure 3:
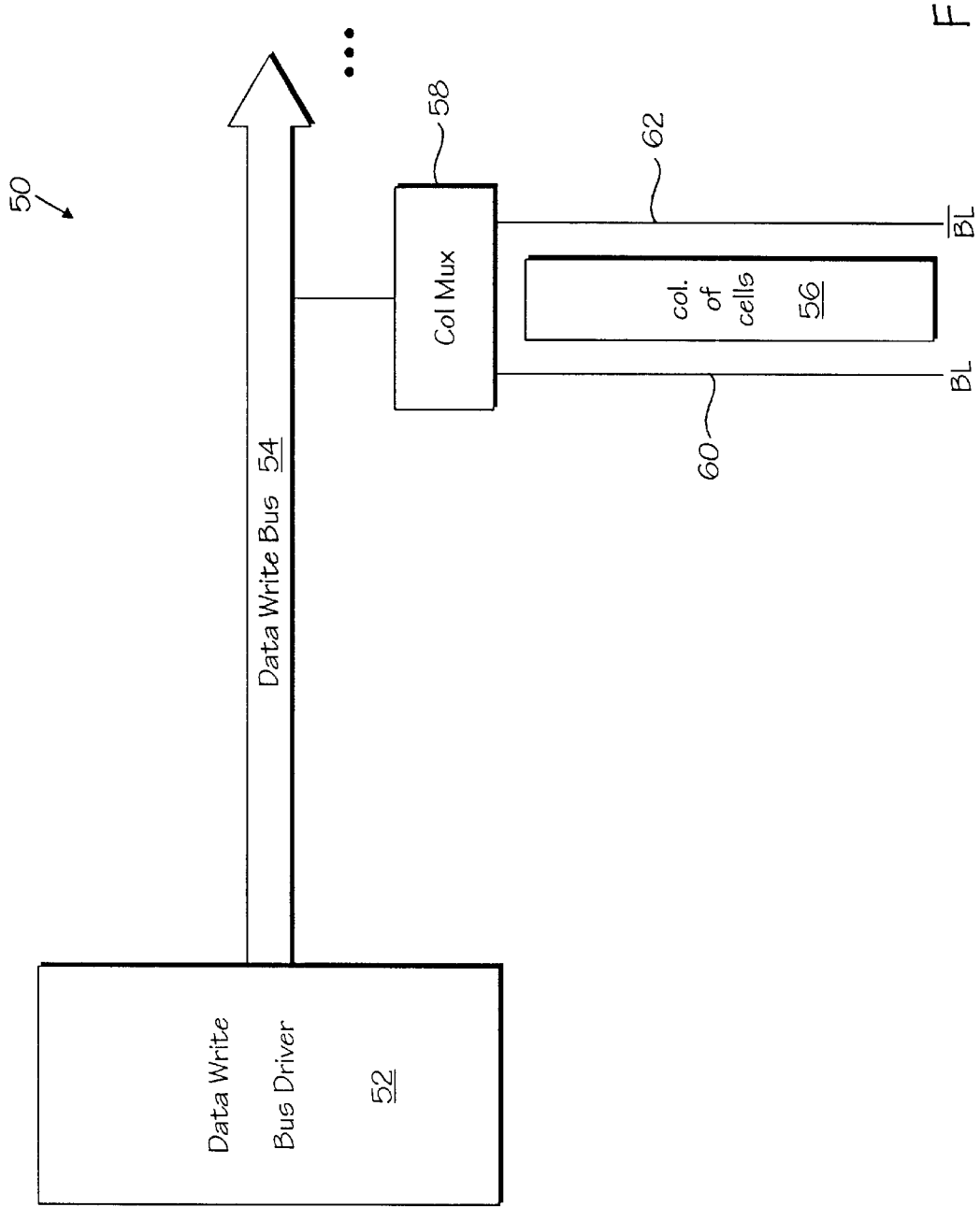
FIG. 3 shows a portion of a data input path for a memory device.

To appreciate the present invention, some reference to the physical layout of a memory device is helpful. Accordingly, FIG. 3 illustrates a portion of a conventional data input path for a memory device 50. Memory device 50 includes a data write bus driver 52 which may correspond generally to the data write driver 24 illustrated in FIG. 1. Data write bus driver 52 is generally located in the periphery (e.g., near the spine if the architecture includes one) of the integrated circuit which comprises memory device 50. Data write bus driver 52 transmits data to be written to selected memory cells of memory device 50 during write cycles along data write bus 54. Data write bus 54 may correspond generally to global data write bus 16 in FIG. 1 and routes data signals from the periphery of memory device 50 to the memory core, generally through a spine. At the memory core, the data signals are applied to a selected column of memory cells 56 through a column multiplexer (col mux) 58. Col mux 58 may be located in a bitline interface 20a–20p of FIG. 1 or may be stand alone circuitry. In general, data signals from data write bus 54 are routed through col mux 58 to a pair of bithines, BL and $\overline{BL}$, 60 and 62, for writing to one of the memory cells in column 56. The individual cell to which the data signal is written is selected using a wordline (not shown) in the conventional manner.

Figure 4:
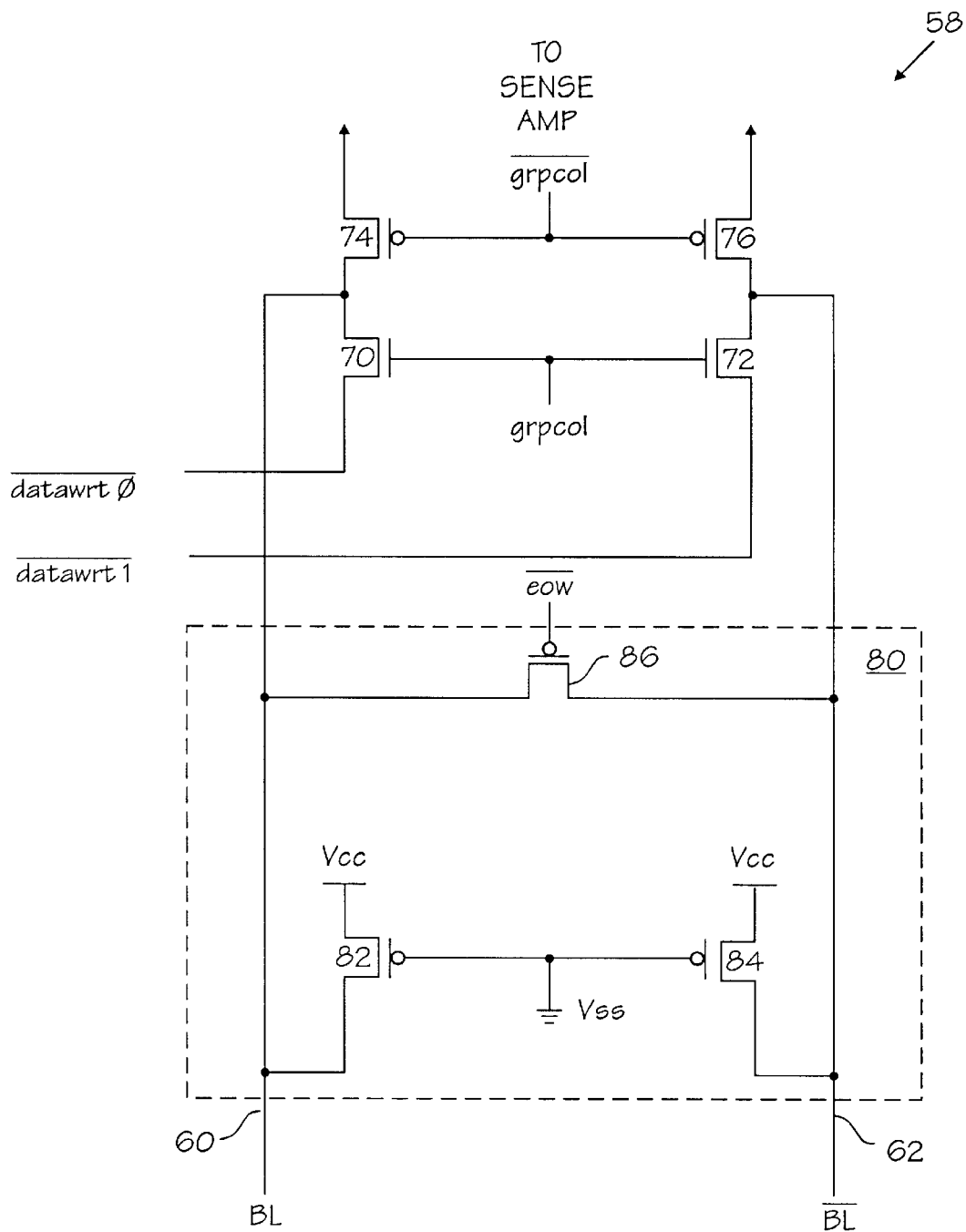
FIG. 4 shows a conventional data write bus to bitline interface for use in a memory device.

FIG. 4 further illustrates col mux 58. Col mux 58 provides circuitry for selecting data paths during write operations and read operations. For example, during write operations, signals $\overline{\text{datawrt0}}$ and $\overline{\text{datawrt1}}$ are provided to col mux 58 from data write bus 54. One of the signals, $\overline{\text{datawrt0}}$ or $\overline{\text{datawrt1}}$, will be logic low and the other will be logic high, depending on whether a logic 0 or 1 is being written to the selected memory cell. The signals $\overline{\text{datawrt0}}$ and $\overline{\text{datawrt1}}$ are applied to the source terminals of n-channel transistors 70 and 72 while a group select signal, grpcol (active high), is applied to the gate terminals of transistors 70 and 72. The group select signal, grpcol, may be generated by group select logic, e.g., logic block 26 shown in FIG. 1, within memory device 50 to select a pair of bitlines, 60 and 62, corresponding to the column of memory cells containing the selected cell the data signal is to be written to. In this way, signal grpcol couples the data signals from the data write bus to the bitlines 60 and 62. During write operations, a specific control signal disables the sense amplifiers.

Notice further that signal $\overline{\text{grpcol}}$ (active low), the logic complement of grpcol, is applied to the gate of p-channel transistors 74 and 76. Transistors 74 and 76 act as passgates, essentially coupling bitlines 60 and 62 to an associated sense amplifier and/or other read path circuitry in memory device 50. During read operations, the data write signals $\overline{\text{datawrt0}}$ and $\overline{\text{datawrt1}}$ are both kept high. The group select signal grpcol cannot activate the passgate transistors 70 and 72 with the source and drain interchanged, because the allowed bitline swing during a read operation is smaller than the threshold voltage of the n-channel transistors 70 and 72. In this way, signals on bitlines 60 and 62 will be passed to the read path circuitry in memory device 50.

Also illustrated in FIG. 4 is bitline equalization circuitry 80. Bitline equalization circuitry 80 includes p-channel transistors 82 and 84 which are coupled between a voltage source (Vcc) and bitlines 60 and 62, respectively. Transistors 82 and 84 provide static bitline equalization in the conventional fashion.

Bitline equalization circuit 80 further includes p-channel transistor 86 which also helps to equalize the voltages on bitlines 60 and 62 following a write operation. To appreciate the function of bitline equalization circuit 80, consider a typical read or write operation. For a write operation, one of the bitlines 60 and 62 will be pulled to a logic low voltage by the signals $\overline{\text{datawrt0}}$ or $\overline{\text{datawrt1}}$. After the write has been completed, in order to prepare for the next memory operation, the bitlines are precharged to a logic high voltage by bitline equalization circuit 80. Preferably, this precharging is done quickly so as to reduce the time required between back-to-back memory operations. During a read operation, one of the bitlines 60 and 62 will be pulled low relative to the other (depending on whether the memory cell being read stores a logic 1 or a logic 0), but (primarily for faster access times) the voltage swing between the two bitlines will be relatively small as compared to the voltage swing during a write operation. After the read operation, the selected memory cell will be decoupled from the bitlines (e.g., by deactivating an appropriate wordline) and bitline equalization circuit 80 will precharge the bitlines 60 and 62 to the logic high level to await the next memory operation.

Because the voltage swing between bitlines 60 and 62 is small during a read operation, e.g., on the order of 500 mV or less, static bitline equalization transistors 82 and 84 are usually sufficient to precharge the bitlines after a read operation. That is, transistors 82 and 84 are of sufficient size to bring the bitlines 60 and 62 back to a reference voltage level after a read operation so that access time to the memory device 50 is not unduly increased. However, to accommodate the large voltage swing produced during a write operation, p-channel transistor 86 is provided as a balancing transistor to provide dynamic equalization between bitlines 60 and 62 at the end of a write cycle. Transistor 86 is activated in response to an end-of-write signal, $\overline{\text{eow}}$.

End-of-write signal $\overline{\text{eow}}$ may be produced by combining various signals within memory device 50, for example, $\overline{WE}$, $\overline{CE}$ and a group select signal. Thus, using this scheme, access to the memory cells (through the bitlines) during a write cycle is defined by a group select signal, grpcol, which allows data signals to be placed on the bitlines, and an end-of-write signal, $\overline{\text{eow}}$, which essentially indicates the end of the write cycle. Address setup and hold margins ($t_{SA}$ and $t_{HA}$) may be controlled by varying the times at which these signals as well as $\overline{\text{datawrt0}}$ and $\overline{\text{datawrt1}}$ are asserted. However, in order to improve address setup time, $t_{SA}$, the beginning of the internal write pulse, $\overline{\text{datawrt0}}$ and $\overline{\text{datawrt1}}$, will need to be delayed (relative to the time that a valid address for the desired memory cell is present on the address bus) and to improve address hold time, $t_{HA}$, the end of the internal write pulse, $\overline{\text{datawrt0}}$ and $\overline{\text{datawrt1}}$, will need to be asserted earlier in the write cycle (with respect to the time that a new address is presented on the address bus). The net effect of these "improvements" is to shorten the time available for actually writing data to the selected memory cell.

Figure 5:
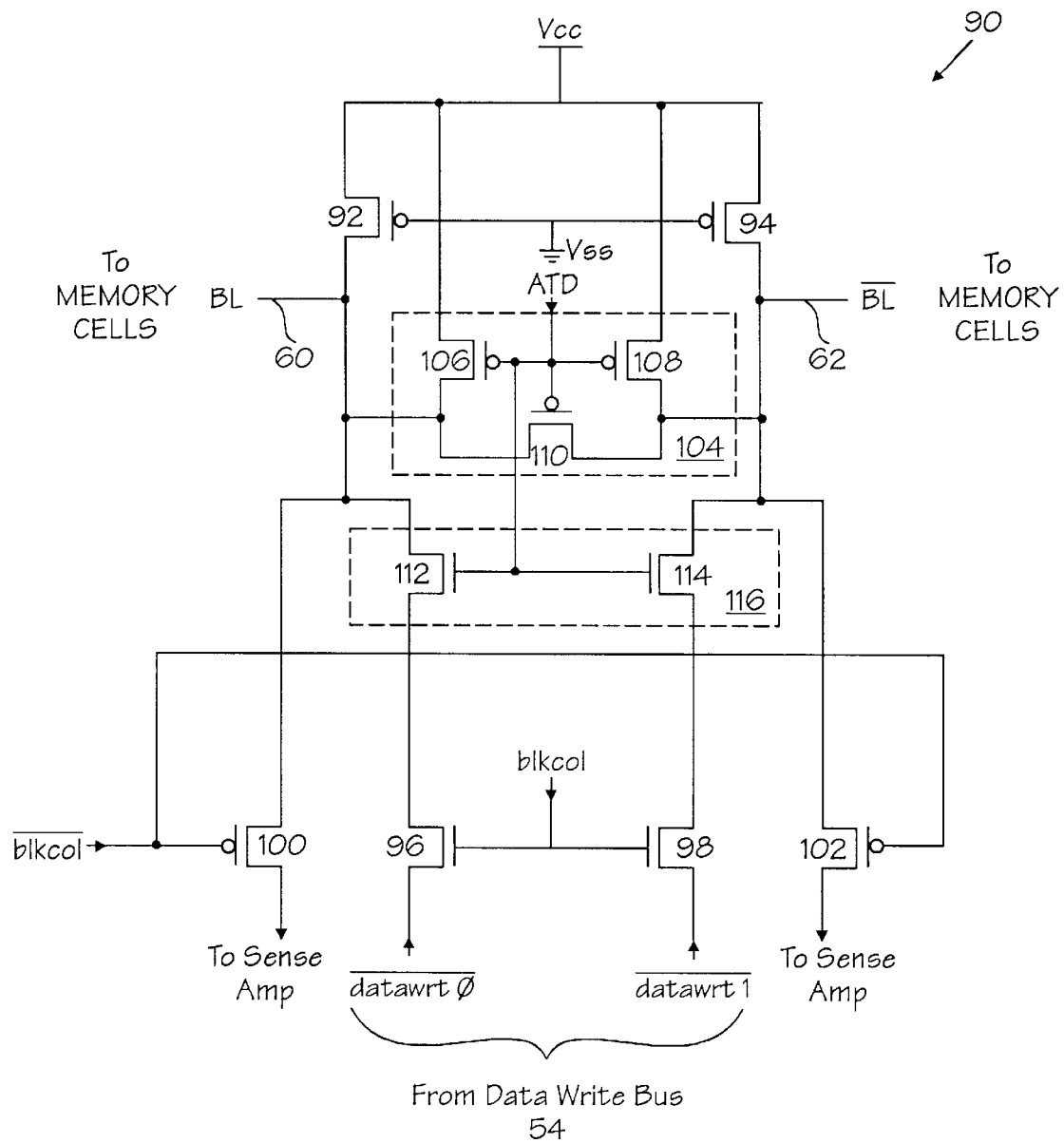
FIG. 5 illustrates a column multiplexer configured in accordance with one embodiment of the present invention.

FIG. 5 illustrates an alternative col mux circuit 90 which is configured in accordance with the present invention. For col mux 90, p-channel transistors 92 and 94 are coupled between Vcc and bitlines 60 and 62, respectively. The gates of transistors 92 and 94 are tied low so that transistors 92 and 94 act as static bitline equalization loads, tending to pull bitlines 60 and 62 high. Thus, transistors 92 and 94 provide a similar function as transistors 82 and 84 in FIG. 4.

Also present in col mux 90 are n-channel transistors 96 and 98. These two transistors couple bitlines 60 and 62 to data write signals $\overline{\text{datawrt0}}$ and $\overline{\text{datawrt1}}$, respectively. Thus, in response to an active blkcol signal applied to the gates of transistors 96 and 98, the data signals (e.g., from data write bus 54) will be applied to the bitlines for writing to a selected memory cell. In this respect, transistors 96 and 98 provide a similar function as transistors 70 and 72 in FIG. 4 and signal blkcol is similar to signal grpcol in FIG. 4. However, as will be discussed further below, transistors 96 and 98 may be much smaller than transistors 70 and 72 because col mux 90 allows for local equalization of the bitlines which will be decoupled from the global data write bus 54 at the end of a write cycle. This saves overall layout area P-channel transistors 100 and 102 act as passgates for coupling the bitlines 60 and 62 to the read path circuitry during a read operation. That is, during read operations, signal $\overline{\text{blkcol}}$ is low, thereby turning on transistors 100 and 102 and coupling bitlines 60 and 62 to the sense amplifiers and other read path circuitry. During write operations, signal $\overline{\text{blkcol}}$ is also low, but a specific control signal disables the sense amplifiers. Transistors 100 and 102 provide a similar function as transistors 74 and 76 shown is FIG. 4 and signal $\overline{\text{blkcol}}$ (the logic complement of blkcol) is similar to signal $\overline{\text{grpcol}}$.

Col mux 90 also includes dynamic bitline equalization circuit 104. Bitline equalization circuit 104 includes p-channel transistors 106, 108 and 110, each having a gate coupled to receive an address transition detection (ATD) signal. The ATD signal is an internally generated signal which uses the transition on an address line to generate a pulse which may also be gated by an area select signal. The pulse may be used for a variety of purposes including internal clock signals and, as shown in FIG. 5, bitline equalization signals. The use of an ATD signal to control bitline equalization is known in the art. As shown in FIG. 5, in response to the ATD signal going low (at the time of an address transition), transistors 106, 108 and 110 will be switched on, helping to equalize the voltages on bitlines 60 and 62 at the end of either a write or a read cycle. This will speed up a potential next read on the same bitlines, but from a cell storing opposite data.

Unlike schemes of the past, however, the ATD signal is also applied to the gates of n-channel transistors 112 and 114 which are coupled as passgates between bitlines 60 and 62 and the data write bus 54. Together, these transistors form an isolation circuit 116. Because the ATD signal is a logic high, except when an address transition (e.g., at the end of a write cycle) produces a logic low pulse, transistors 112 and 114 are usually on, thereby allowing data signals from data write bus 54 to be coupled to bitlines 60 and 62 under the control of transistors 96 and 98. However, when the ATD signal pulses low, e.g., at the end of a write cycle, transistors 112 and 114 are turned off, decoupling the bitlines 60 and 62 from data write bus 54. At the same time, bitline equalization is performed using bitline equalization circuit 104 which is also responsive to the logic low ATD pulse. Because transistors 112 and 114 are decoupling the bitlines from the data write bus during bitline dynamic equalization, transistors 96 and 98 can be smaller than was the case for transistors 70 and 72 shown in FIG. 4, because they are not in the path which charges the relatively large capacitance of the bitlines together with the data write bus during their equalization. Thus, transistors 96 and 98 may be smaller than transistors 70 and 72, thereby conserving layout area.

During read operations, even though one of the bitlines 60 and 62 will experience a logic low swing with respect to the other, the voltage difference will not be sufficient to open either of passgate transistors 112 or 114. This is because a maximum bitline swing of approximately 500 mV is present during the memory read and the threshold voltage, $V_t$, for transistors 112 and 114 is greater than this voltage. In addition, the body effect increases their threshold voltage and makes it even less likely that transistors 112 and 114 will open during a read.

The use of transistors 112 and 114 in the fashion described above makes it possible to gain address setup and hold margins, $t_{SA}$ and $t_{HA}$, without narrowing the internal write pulse. Because the transistors 112 and 114 are controlled by the ATD signal, data signals from the data write bus 54 are blocked whenever the ATD signal is low. That is, when an address transition is recognized, either at the beginning or the end of a memory write cycle, the ATD pulse will be low and transistors 112 and 114 will be off. Consequently, data signals $\overline{datawrt0}$ and $\overline{datawrt1}$ will be decoupled from bitlines 60 and 62 and these signals cannot be written to a memory cell coupled to the bitlines. Also, transistors 112 and 114 protect the memory from crowbarring the bitlines in case a user attempts to "illegally" change the address and, thus, dynamically equalize the bitlines during a write.

Figure 2:
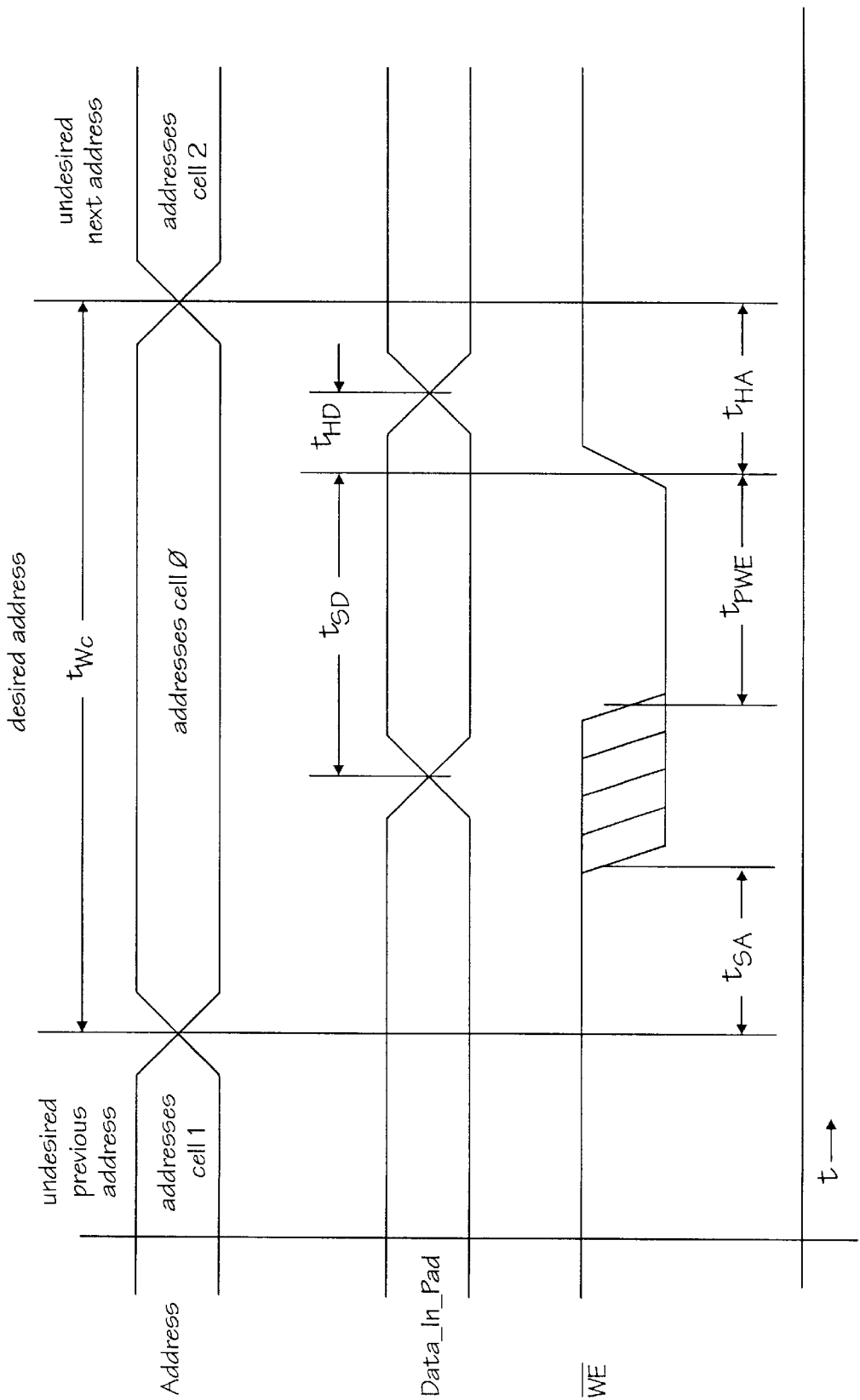
FIG. 2 illustrates a conventional write cycle for a memory device.

Ordinarily, an address transition will occur before a write enable signal is applied, thereby ensuring that the memory write is to a desired address. For example, as shown in FIG. 2, the write enable signal $\overline{WE}$ is applied sometime after the address transition signifying the beginning of the write cycle. Under such conditions, transistors 112 and 114 of col mux 90 in FIG. 5 will be on at the time $\overline{datawrt0}$ or $\overline{datawrt1}$ becomes active. This is because the prior address transition will have pulsed the ATD signal low, turning off transistors 112 and 114, but by the time $\overline{datawrt0}$ or $\overline{datawrt1}$ goes low after the activation of $\overline{WE}$, the ATD signal will be high and so transistors 112 and 114 will be on. Thus, it is the $\overline{WE}$ signal (which is combined with other signals to generate the $\overline{datawrt0}$ and $\overline{datawrt1}$ signals) which controls the write.

Figure 6:
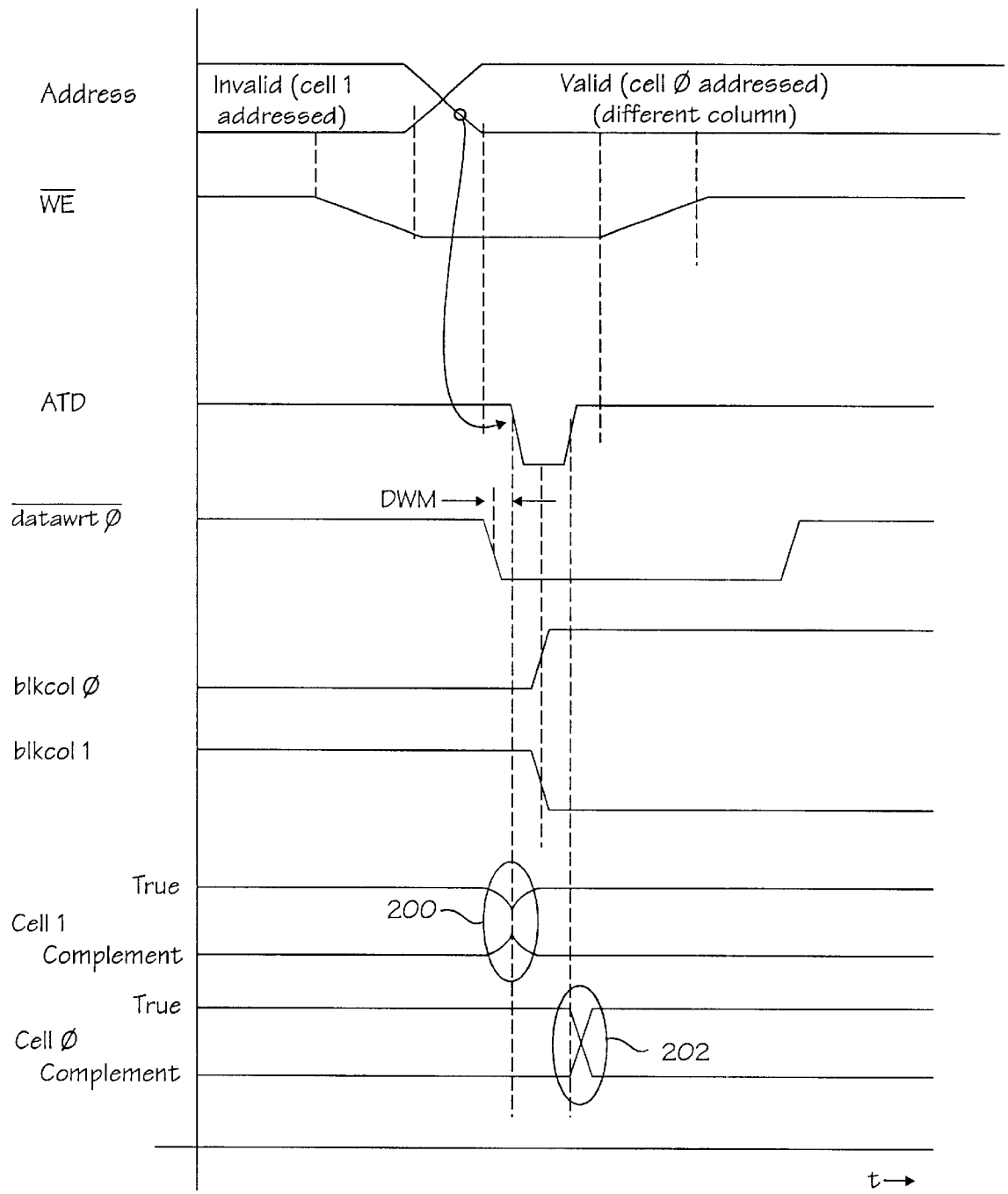
FIG. 6 is a timing diagram illustrating the blocking of an undesired memory write to a previous address when an address transition occurs after the beginning of a memory write cycle ($t_{SA}$ condition) according to one embodiment of the present invention.

However, the present invention prevents a memory write to the wrong memory cell even under the worst case situations where the address transitions indicating the beginning and end of a memory write cycle occur after the write enable signal is activated (improved $t_{SA}$ margin) and, respectively, before the rising edge of $\overline{WE}$ (improved $t_{HA}$ margin). For example, consider the memory write situation illustrated in FIG. 6. FIG. 6 presents various waveforms of interest for a situation where a memory write to a memory cell 0 (and not to a memory cell 1 belonging to a different column, i.e., different bitlines) is desired (improved $t_{SA}$ margin).

As shown, in this example a write enable signal $\overline{WE}$ is asserted at a time when an invalid address is still present on the address bus. The invalid address corresponds to memory cell 1 so that when $\overline{WE}$ is asserted (active low), an internal write enable pulse, e.g., Internal_Write signal 14, is generated and $\overline{datawrt0}$ becomes active, i.e., attempting to write a logic 0. At the time the internal enable write pulse is produced, a signal blkcol 1 is still active (logic high). This corresponds to a column select signal for a column of memory cells containing memory cell 1. Consequently, transistors 96 and 98 for a col mux circuit 90 corresponding to the column of memory cells containing cell 1 will be activated and the data signals (e.g., $\overline{datawrt0}$) present on the global data write bus will be coupled to the bitlines 60 and 62 for memory cell 1. This is shown as area 200 in FIG. 6 where an attempted write of a logic 0 to memory cell 1 is initiated (the waveform "cell 1" illustrates the logic levels for the true and complement nodes of the memory cell, which follow the logic states of the bitlines coupled to cell 1).

However, before this undesired write can be completed, the ATD pulse is produced as a result of the transition on the address bus. The address transition corresponds to the new (valid) address of memory cell 0 (the intended location for the memory write operation). The ATD pulse blocks the unintended write to cell 1 by decoupling the bitlines of cell 1, which start being dynamically equalized, from the data signal on the global data write bus. That is, the ATD pulse, applied to the gates of transistors 112 and 114 for the col mux 90 corresponding to cell 1 turns off these transistors, thus preventing the undesired write to cell 1. Also, simultaneously, the ATD pulse applied to the gates of the p-channel transistors 106, 108 and 110 turns them on, starting the equalization of the bitlines connected to cell 1.

As further illustrated, once the ATD pulse is removed, the write operation of the valid address (corresponding to cell 0) begins, because the blkcol0 signal is already activated, approximately in the middle of the ATD pulse duration. The signal blkcol0 activated transistors 96 and 98 of a col mux 90 corresponding to a column of memory cells containing cell 0 and, as a result, when the ATD signal goes high, turning on transistors 112 and 114, the data signals from global data write bus 54 are applied to bitlines 60 and 62 of memory cell 0. This is illustrated as area 202 in FIG. 6 where the write to cell 0 is completed. Thus, so long as the time between the beginnings of the internal write pulse and the ATD pulse do not exceed a "Don't Write Margin" (DWM) value, the present invention prevents a memory write to an undesired location without narrowing the internal write pulse. The DWM value will vary according to the technology comers of the device and for the embodiment shown in FIG. 5 is approximately 700 psec for a 12 nsec part operating at −10° C., 5.6 V and having fast p-channel and fast n-channel (CMOS technology) transistors.

Figure 7:
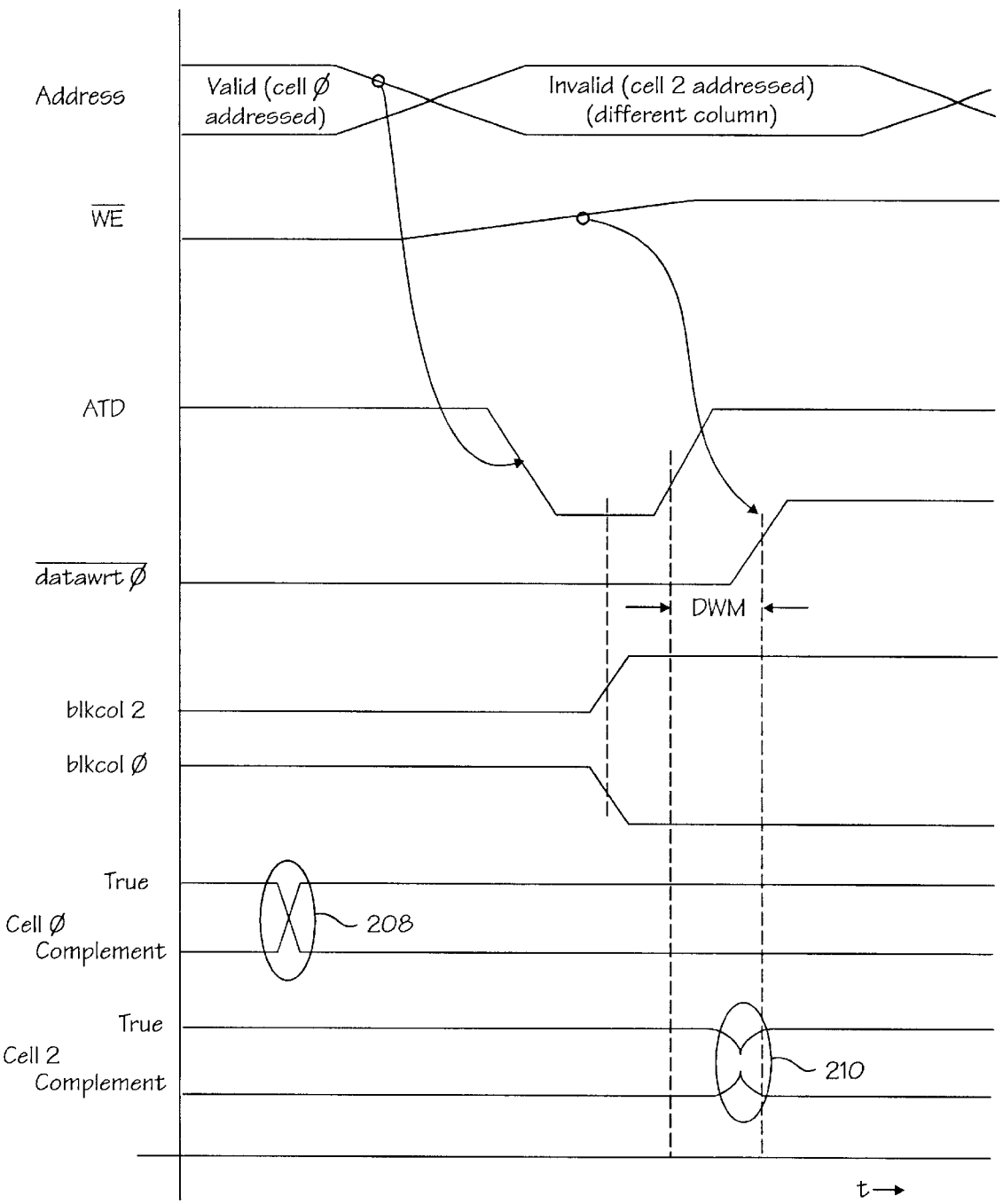
FIG. 7 is a timing diagram illustrating the blocking of an undesired memory write to a next address when an address transition precedes the end of a memory write cycle ($t_{HA}$ condition) according to one embodiment of the present invention.

The present invention also prevents undesired writes when an address transition occurs before the end of a current write cycle (improved $t_{HA}$ margin). For example, as shown in FIG. 7 (when an address transition precedes an end of write), the address signal will transition, causing an ATD pulse to be generated. The ATD pulse will be applied to the gates of transistors 112 and 114 in the col mux circuits 90 in the memory device, preventing data from being written to memory cell 2. In FIG. 7 it is shown in area 208 that a memory write to the intended cell 0 has already occurred before the end of the write cycle. The object therefore is to prevent the same data (logic 0) already written to the proper cell 0 from being rewritten to an improper memory cell 2.

When the ATD pulse returns to a logic high, the transistors 112 and 114 will turn on, allowing data to be coupled from the data write bus 54 to a pair of bitlines 60 and 62 under the control of a blkcol signal which already switched active for the column containing cell 2 at approximately the middle of the ATD pulse. In this case, the data write signal $\overline{datawrt0}$ is still low (indicating that the current write cycle of a logic 0 has not been completed) at the time the ATD signal returns to a logic high, and the blkco12 signal (which is generated as a result of the address now present on the address bus) is asserted. Under these circumstances, invalid data may be written to cell 2, as shown by the transition in signal cell 2 at area 210. However, this unwanted write is prevented because the data write signal $\overline{datawrt0}$ transitions to a logic high (as a result of the $\overline{WE}$ signal being deasserted at the end of the previous write cycle). In effect, the ATD pulse has delayed, with approximately half of its width, the time at which the undesired write will be attempted, and this time is such that the undesired write is cut off by the end of the data write signal, as long as the duration between the rising edges of the ATD pulse and the data write pulse does not exceed the DWM. Thus, the present invention has accommodated even the worst case scenario of address transitions following the beginning and/or preceding the end of a write cycle without narrowing the width of the internal write pulse 14 or the data write signals $\overline{datawrt0}$ and $\overline{datawrt1}$.

Although one embodiment of the present invention involves the use of passgate transistors 112 and 114 in a col mux 90 as described above, other embodiments are contemplated. For example, the present invention may also find application at a data write bus driver, such as data driver 52 shown in FIG. 3. Such an embodiment is illustrated in FIG. 8.

Figure 1:
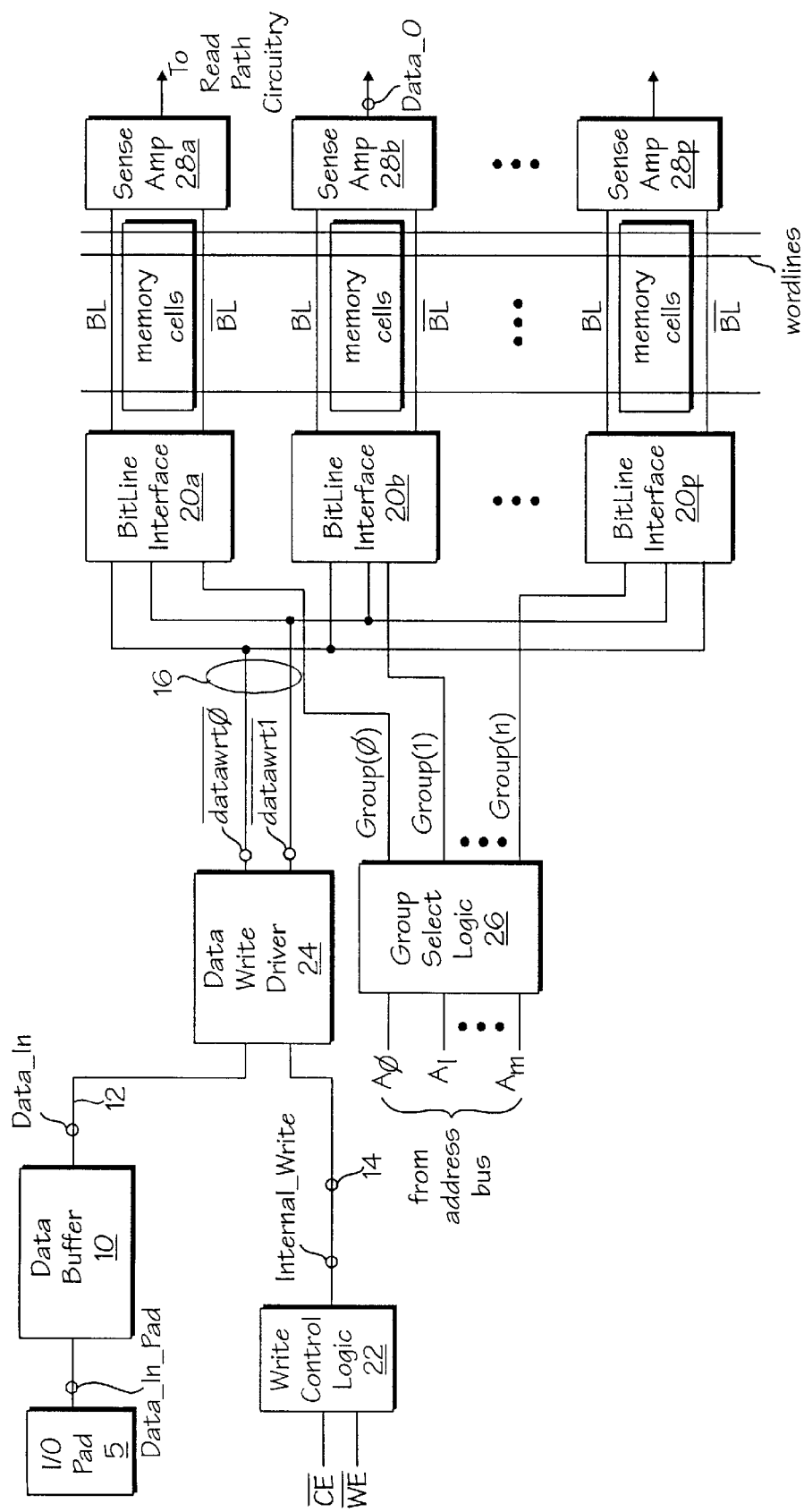
FIG. 1 illustrates data input circuitry in a conventional memory device.
Figure 8:
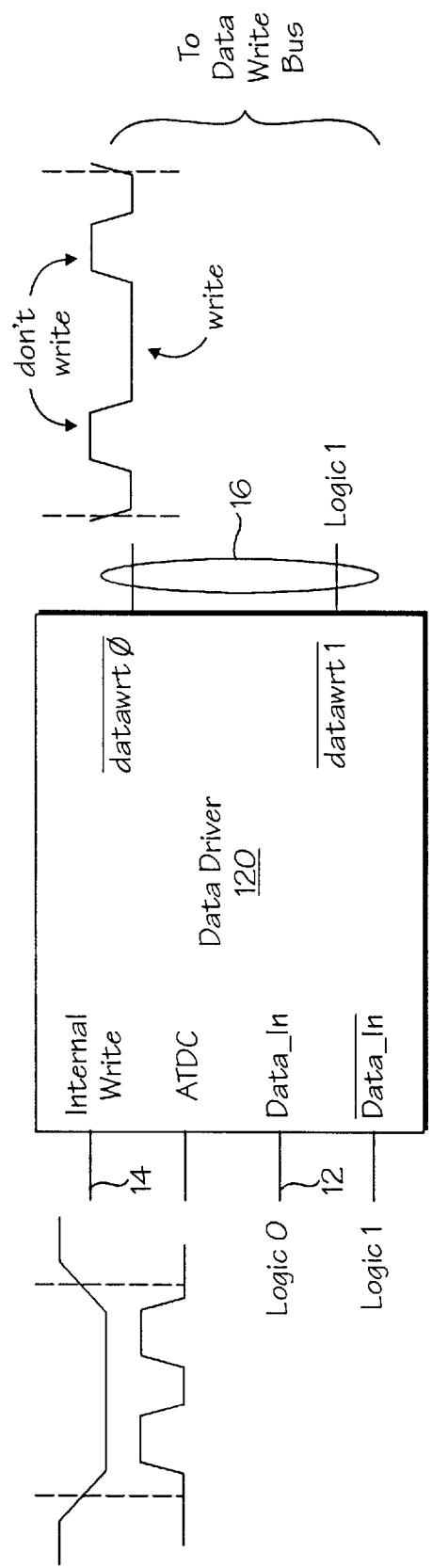
FIG. 8 shows a data driver for a memory device configured in accordance with yet another embodiment of the present invention.

Data driver 120 shown in FIG. 8 replaces, for example, data driver 24 shown in FIG. 1. Data driver 120 receives as inputs an internal write enable signal 14, an ATDC signal representing a combination of all ATD signals for all address lines of an address bus, and signals Data_In and $\overline{Data\_In}$ representing a data signal (e.g., from data buffer 10 on line 12) and its logic complement. In response to these inputs, data driver 120 produces signals $\overline{datawrt0}$ and $\overline{datawrt1}$ which are provided to a global data write bus in the memory device.

For illustration purposes, the address is shown to switch twice (as indicated by the two ATDC pulses) within a single internal write enable pulse 14 (active low). The corresponding data write signal $\overline{datawrt0}$ is blocked at both assertions of ATDC. In practice, a maximum of one address transition within a single internal write enable pulse would be expected if the user complies with the device specifications, in order not to violate the write cycle time. Thus, data driver 120 is configured to block an undesired memory write in response to an ATD signal.

Although the embodiment illustrated in FIG. 8 is contemplated, it is not preferred over the embodiment illustrated in FIG. 5, especially for memory devices which use an ATD pulse to dynamically equalize the bitlines. This is because the embodiment of FIG. 8 is prone to bitline crowbar conditions which are avoided in the FIG. 5 embodiment. Crowbar may occur when an address transition occurs and the dynamic bitline equalization transistors become active (e.g., through application of an ATD pulse) while one of the data write lines is still low. Such a condition would result in a direct path being provided between Vcc and ground, presenting a significant current sink. Because of the finite periods of time required for an ATDC signal to be generated to cut the data write signal in the data driver 120 and to propagate back to a bitline equalization circuit through the data write bus, crowbar may be experienced with the FIG. 8 embodiment in those memory devices equalizing the bitlines dynamically using an ATD pulse. However, with the FIG. 5 embodiment, the write is blocked locally (i.e., at the col mux where the bitline equalization is done), in synch with the p-channel pull-up dynamic equalization. Thus, there are no significant propagation delays and bitline crowbar is avoided.

For the FIG. 5 embodiment then, an ATD pulse is used to block an undesired memory write through the use of passgate transistors 112 and 114. The undesired memory location cannot be written so long as the duration between the beginning of the specific $\overline{datawrt}$ signal and the beginning of the ATD pulse (FIG. 6, for $t_{SA}$), or between the end of the ATD pulse and the end of the specific $\overline{datawrt}$ pulse (FIG. 7, for $t_{HA}$) does not exceed a corner specific value DWM (Don't Write Margin). Note that for an address transition prior to the end of the internal write signal (e.g., as shown in FIG. 7), the negative ATD pulse delays the write to the undesired memory location and the DWM (approximately 760 psec for the embodiment presented in FIG. 5) is just sufficient for the end of the $\overline{datawrt0}$ signal (rising edge) to block the writing of cell 2.

FIGS. 6 and 7 show that for the above-described embodiment, the address of the memory cell selected for write operation (as indicated by the transitions of signals blkco10, blkco11 and blkco12) changes at approximately the middle of the ATD pulse. This makes the improvement of the $t_{SA}/t_{HA}$ margin approximately equal to one-half the width (time duration) of the ATD pulse. At the same time, the width (time duration) of the internal write enable pulse 14 and, thus, the $\overline{datawrt0}$ and $\overline{datawrt1}$ pulses, has not been altered, and the wider (than is available using solutions of the past) internal write pulse helps with SS (i.e., slow) corner write parameters (e.g., $t_{PWE}$, $t_{SCE}$).

Thus, a circuit and method for enhancing write parameter margins within a memory device without relying on narrowing an internal write pulse have been described. Although discussed with reference to certain illustrated embodiments, those skilled in the art will appreciate that various modifications may be made thereto, without departing from the broader spirit and scope of the present invention. For example, using common circuit design practices, n-channel transistors may be replaced with p-channel transistors, and vice-versa, so long as gate control signals of the proper logic levels are provided. Thus, the embodiments discussed above should be regarded as illustrative only and the present invention measured only in terms of the claims which follow.

What is claimed is:

1. A method comprising the steps of:

generating an address transition detection (ATD) pulse in response to an address transition at a memory device; and preventing a memory write to an undesired memory location within said memory device and equalizing bitlines associated with said memory location in response to said ATD pulse.

2. A method as in claim 1 wherein said step of preventing said memory write further comprises the step of:

decoupling said bitlines from a data signal in response to said ATD pulse.

3. A method as in claim 2 wherein said step of decoupling said bitlines further comprises the step of:

deactivating passgate transistors coupled between said bitlines and said data signal.

4. A method as in claim 3 further comprising the step of:

allowing said memory write to a desired memory location within said memory device.

5. A method as in claim 4 wherein said step of allowing said memory write further comprises the step of:

coupling said data signal to said bitlines by deasserting said ATD pulse.

6. A method as in claim 1 wherein said step of preventing a memory write further comprises the steps of:

pulsing an address transition detection (ATD) signal to delay said memory write to said undesired memory location; and blocking said memory write to said undesired memory location by deasserting a data write signal.

7. A method as in claim 6 wherein said step of pulsing an ATD signal further comprises the step of:

decoupling said bitlines from a data signal in response to said ATD signal.

8. A method as in claim 7 wherein said step of decoupling said bitlines further comprises the step of:

deactivating passgate transistors coupled between said bitlines and said data signal.

9. A circuit, comprising:

a memory cell;

an isolation circuit coupled to said memory cell via one or more bitlines and configured to prevent a memory write from a data write bus to said memory cell in response to an address transition detection (ATD) signal; and a dynamic bitline equalization circuit coupled to said isolation circuit and said memory cell, said dynamic bitline equalization circuit being responsive to said ATD signal.

10. A circuit as in claim 9 wherein said isolation circuit comprises a pair of passgate transistors.

11. A circuit as in claim 10 wherein said passgate transistors are each coupled between said memory cell and said data write bus.

12. A memory device, comprising:

a pair of bitlines; and an isolation device coupled between said bitlines and a data bus, said isolation device configured to decouple said data bus from said bitlines and to dynamically equalize said bitlines in response to an address transition detection (ATD) signal.

13. A memory device as in claim 12 wherein said isolation device comprises a a pair of transistors each having a gate coupled to receive said ATD signal, a source coupled to receive a data signal from said data bus and a drain coupled to a respective one of said bitlines.

14. A memory device as in claim 13 further comprising select transistors coupled between said data bus and said bitlines, said select transistors being gated by a signal indicating a memory access to a memory cell coupled to said bitlines.

15. A memory as in claim 14 wherein said select transistors are further coupled between said data bus and said isolation device.

* * * * *